United States Patent [19]

Zhu et al.

[11] Patent Number: 5,768,181

[45] Date of Patent: Jun. 16, 1998

[54] MAGNETIC DEVICE HAVING MULTI-LAYER WITH INSULATING AND CONDUCTIVE LAYERS

[75] Inventors: Theodore Zhu, Chandler; Saied N. Tehrani, Tempe, both of Ariz.

[73] Assignee: Motorola, Inc., Schaumburg, Ill.

[21] Appl. No.: 834,968

[22] Filed: Apr. 7, 1997

[51] Int. Cl.$^6$ ..................................................... G11C 7/00
[52] U.S. Cl. ............................ 365/158; 365/171; 365/173
[58] Field of Search ............................... 365/158, 173, 365/171; 360/113, 119

[56] References Cited

U.S. PATENT DOCUMENTS 5,173,873  12/1992  Wu et al. ............................ 365/173
5,465,185  11/1995  Heim et al. ......................... 360/113
5,640,343   6/1997  Gallagher et al. ................... 365/173

Primary Examiner—Vu A. Le
Attorney, Agent, or Firm—Eugene A. Parsons

[57] ABSTRACT

A magnetic device (40) having multi-layer (41–45) with insulating layer (45) and conductive layer (42). The conductive layer (42) is positioned between a first magnetic layer (41) and a third magnetic layer (44). The insulating layer (45) is positioned between a second magnetic layer (43) and the third magnetic layer (44), and which forms a tunnel junction between the second and third layers. Magnetic vectors in the first magnetic layer (41) magnetically couple with ones in the second magnetic layer (43) so that the magnetic coupling loop formed around the third magnetic layer (44) allows magnetic vectors in the third magnetic layer (44) to be switchable in a low magnetic field. Consequently, total power consumption of the magnetic device (60) decreases.

20 Claims, 3 Drawing Sheets

MAGNETIC DEVICE HAVING MULTI-LAYER WITH INSULATING AND CONDUCTIVE LAYERS

FIELD OF THE INVENTION

The present invention pertains to a magnetic device, and more specifically to a magnetic random access memory (MRAM) cell having multi-layer with insulating and conductive layers.

BACKGROUND OF THE INVENTION

In the past, a variety of magnetic materials and structures have been utilized to form magnetoresistive materials for non-volatile memory elements, read/write heads for disk drives, and other magnetic type applications. One prior magnetoresistive element utilized a magnetoresistive material that has two magnetic layers separated by a conductor layer. The magnetization vectors of the two magnetic layers typically are anti-parallel to each other in the absence of any magnetic fields. The magnetization vectors of one of the layers points in one direction and the magnetization vector of the other layer always points in the opposite direction. The magnetic characteristics of such magnetic materials typically require a width greater than one micron in order to maintain the orientation of the magnetization vectors along the width of the cell. The large width requirement limits the density of memories utilizing such materials. Additionally, reading the state of such memories typically requires a two-phase read operation that results in very long read cycles. The two phase read operation also requires extra circuitry to determine the state of the memory, thus increasing the cost of such memories. An example of such a magnetic material and memory is disclosed in U.S. Pat. No. 4,780,848 issued to Daughton et al. on Oct. 25, 1988.

Another prior material uses multi-layer giant magnetoresistive materials (GMR) and utilizes submicron width, in order to increase density. In this structure the magnetization vectors are parallel to the length of the magnetic material instead of the width. In one embodiment the magnetization vector of one magnetic material layer is always maintained in one direction while the magnetization vector of the second magnetic layer switches between parallel and anti-parallel to the first vector in order to represent both logical "0" and "1" states. In order to determine the logical state of a memory cell utilizing this material, the memory cell consists of a reference cell and an active cell. The reference cell always provides a voltage corresponding to one state (either always a "1" or always a "0"). The output of the reference cell is compared to the output of the active cell in order to determine the state of the memory cell. The requirement for an active and a reference cell reduces the density of a memory that utilizes such elements. Additionally, each memory cell requires transistors to switch the active and reference cells at appropriate times in order to read the cells. This further increases the cost of the memory.

A magnetic random access memory (MRAM) is a non-volatile memory which basically includes a giant magnetoresistive (GMR) material, a sense line, and a word line. The MRAM employs the GMR effect to store memory states. Magnetic vectors in one or all of the magnetic layers of GMR material are switched very quickly from one direction to an opposite direction when a magnetic field is applied to the GMR material over a certain threshold. According to the direction of the magnetic vectors in the GMR material, states are stored, for example, one direction can be defined as a logic "0", and another direction can be defined as a logic "1". The GMR material maintains these states even without a magnetic field being applied. The states stored in the GMR material can be read by passing a current through the cell in a sense line, because of a difference between the resistances of the two magnetic states. An MRAM device consumes much more power to read/write states as the switching field of the device is rather high.

Accordingly, it is highly desirable to provide magnetic random access memories and memory cells which have low power consumption.

It is a purpose of the present invention to provide a new and improved multi-state, multi-layer magnetic memory cell.

It is another purpose of the present invention to provide a new and improved array of multi-state, multi-layer magnetic memory cells.

It is still another purpose of the present invention to provide a new and improved multi-state, multi-layer magnetic memory cell which utilizes less sensing current and produces a larger change between states.

It is a further purpose of the present invention to provide a new and improved multi-state, multi-layer magnetic memory cell which is faster and simpler to sense.

SUMMARY OF THE INVENTION

The above problems and others are substantially solved and the above purposes and others realized by a magnetic random access memory cell having multi-layer with insulating and conductive layers, the cell having a first magnetic layer, a second magnetic layer, and a third magnetic layer. The conductive and the insulating layers are positioned between first and third magnetic layers and between second and third magnetic layers, respectively. Magnetization vectors in the first magnetic layer are coupled with ones in the second magnetic layer, and vectors in both layers point to an antiparallel direction. The third layer has magnetization vectors which are switchable under a low magnetic field.

BRIEF DESCRIPTION OF THE DRAWINGS

Referring to the drawings.

DESCRIPTION OF THE PREFERRED EMBODIMENTS

Figure 1:
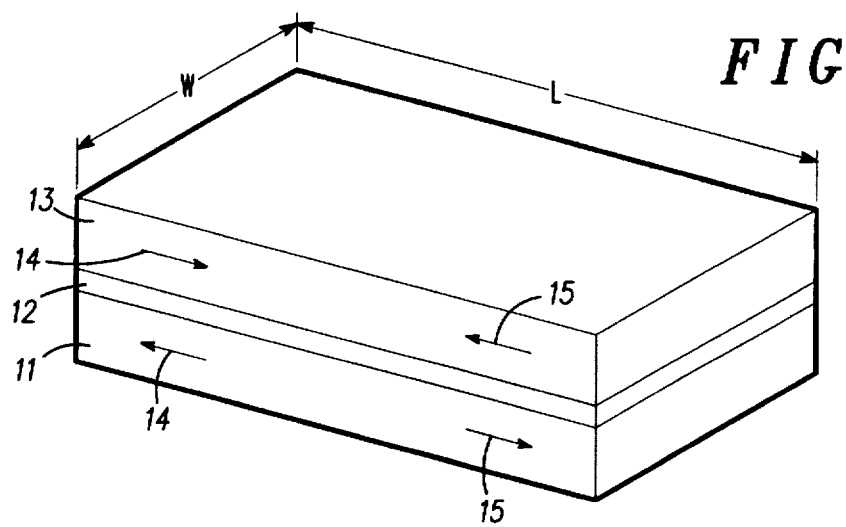
FIG. 1 is a simplified perspective view of a multi-layer magnetic memory cell including layers with different thicknesses.

Turning now to the drawings, FIG. 1 illustrates a simplified perspective view of a multi-layer magnetic memory cell 10 including layers with different thicknesses. Cell 10 includes a first magnetic layer 11 and a second magnetic layer 13, which are separated by an insulating spacer layer 12. Magnetic layers 11 and 13 each can be single layers of ferromagnetic materials such as a layer of nickel, iron, cobalt, or alloys thereof including alloys having palladium or platinum therein. Alternatively, either of layers 11 and 13 can be a composite ferromagnetic layer, such as a layer of nickel-iron-cobalt covering a layer of cobalt-iron or three layer structures including layers of cobalt-iron and nickel-iron-cobalt and cobalt-iron with cobalt-iron at the interface with adjacent layers. Materials that are suitable for layer 12 include most non-conductive materials such as oxides, nitrides, dielectrics, etc. Additionally, layers 11, 12 and 13 have a width W and a length L as shown in FIG. 1. A relationship of a length/width ratio (L/W ratio) and a strength of magnetic field required to switch states stored in cell 10 are explained next.

Figure 2:
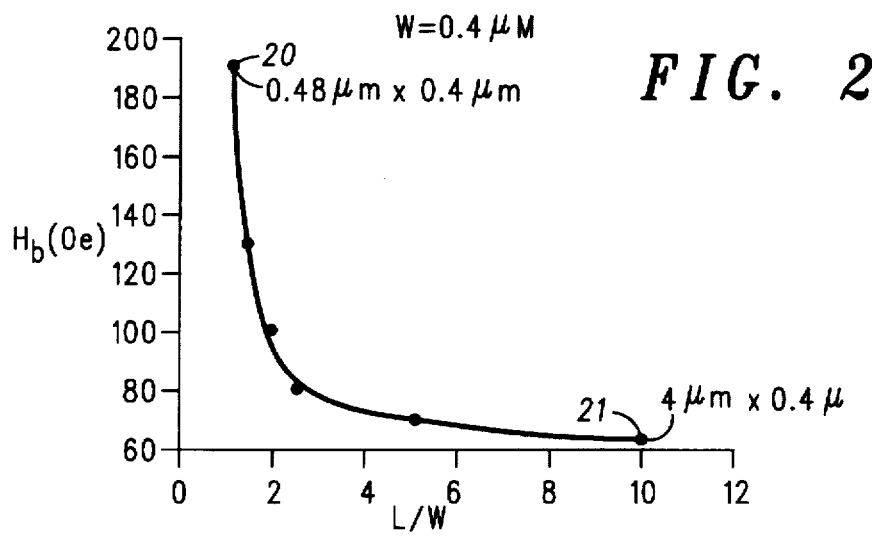
FIGS. 2 and 3 are graphs illustrating the actual magnetic field required to switch the thicker and thinner layer, respectively versus a L/W ratio of a magnetic cell, such as the cell illustrated in FIG. 1 with a fixed width

Referring now to FIG. 2, the graph illustrated shows actual magnetic fields required to switch states of thicker magnetic layer 11 in magnetic memory cell 10 of FIG. 1 versus the L/W ratio of the magnetic cell. The graph illustrated in FIG. 2 is developed using magnetic cells, such as cell 10 of FIG. 1, with a fixed width which in this specific example is 0.4 micrometers. Also, the length of the magnetic cells utilized to develop the graphs of FIG. 2 range between 0.48 micrometers at a point 20 to 4.0 micrometers at a point 21. The graph of FIG. 2 illustrates that a magnetic field with a strength greater than approximately 60 Oersteds is required to switch the state of layer 11 in cell 10 if the L/W ratio of cell 10 is in a range of approximately 1.2 to 10. Thus, a magnetic memory cell having a L/W ratio in a range of 4 to 10 requires a low switching current, however the cell requires a very high switching current as the L/W ratio approaches from 5 to 1.

Figure 3:
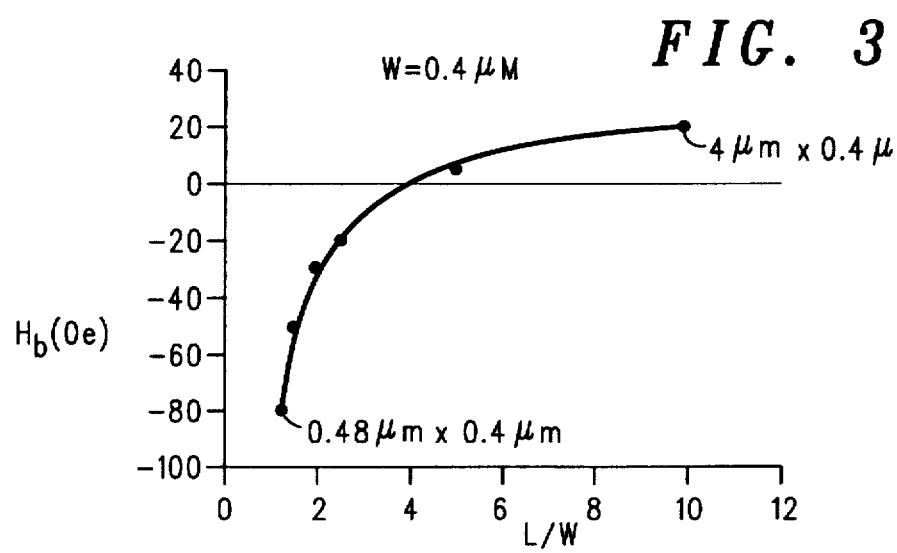

FIG. 3 illustrates the switching characteristics of a thin layer as a function of length to width ratio. The magnetostatic coupling between the two magnetic layers increases with decreasing length to width ratio. As can be seen in FIG. 3, cells having a L/W ratio of greater than approximately 5 the first and second layers of magnetic material are ferromagnetically coupled since it takes a positive field to switch, while in cells having a L/W ratio of less than approximately 5 the first and second layers of magnetic material are antiferromagnetically coupled. Generally, for purposes of this disclosure the term "ferromagnetically coupled" means that either of the parallel states is stable and does not require a constant magnetic field. Also, for purposes of this disclosure the term "antiferromagnetically coupled" means that either of the antiparallel states (magnetic vectors 14 or 15, in FIG. 1) is stable and that the parallel state is unstable and does require a constant magnetic field, since the magnetic vectors always tend to move to an antiparallel state.

Figure 4:
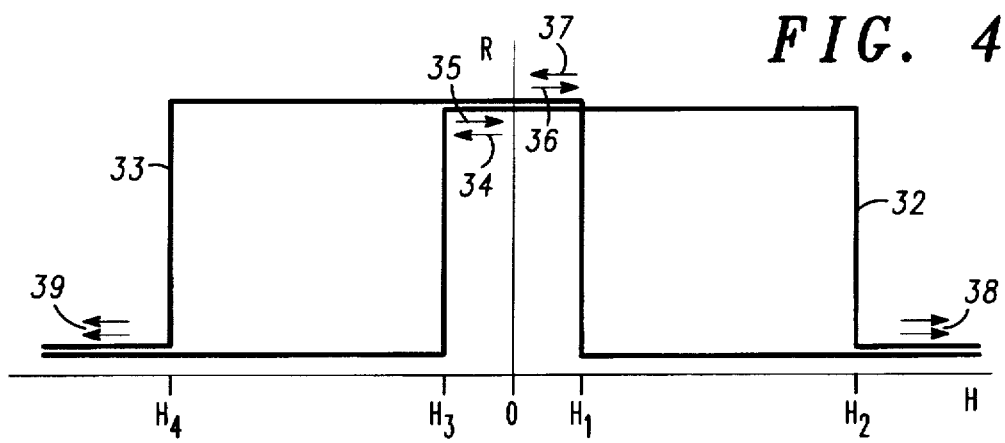
FIG. 4 is a graph generally illustrating switching characteristics of the cell of FIG. 1 having the L/W ratio in a range of 1 to 5.

Referring specifically to FIG. 4, a graph is generally illustrated showing the resistance of cell 10 having a L/W ratio in a range of 1 to 5 versus different directions of orientation for the magnetic vectors in layers 11 and 13. Also, the direction and strength of an applied magnetic field, required to achieve the various vector directions is shown. The abscissa of the graph indicates magnetic field direction and strength and the ordinate represents the resistance of cell 10. Further, a first curve 32 indicates the cell resistance which can be achieved for the application of various strengths of a magnetic field in a first direction and curve 33 indicates the cell resistance which can be achieved for the application of various strengths of a magnetic field in a second direction. Vectors 34 and 35 are illustrated with curve 32 and represent the magnetic vectors in layers 11 and 13, respectively, for the application of a magnetic field between values $H_3$ and $H_2$ in the positive direction along the abscissa. Similarly, vectors 36 and 37 are illustrated with curve 33 and represent the magnetic vectors in layers 11 and 13, respectively, for the application of a magnetic field between values $H_4$ and $H_1$ in the negative direction along the abscissa.

Assuming cell 10 is in the state in which vectors 34 and 35 point to the antiparallel under no magnetic field, moving to the right along the abscissa, the magnetic field increases up to a value $H_2$. Before the value $H_2$ is reached, magnetic vectors 34 and 35 are oriented in the antiparallel, and the resistance of cell 10 is high. Upon applying sufficient magnetic field to cell 10, herein designated by the value $H_2$, vector 34 of layer 11 switches to the right direction (as shown) and the resistance of cell 10 decreases perceptibly. Then, both vectors, which is represented by vectors 38, point in the same direction to the right under a magnetic field beyond the value $H_2$. When the magnetic field decreases down to a value $H_1$ moving to the left along the abscissa, vectors 38 hold the same direction between values $H_2$ and $H_1$. Upon applying the magnetic field of the value $H_1$, a magnetic vector of layer 13 switches to the left direction, represented as vector 37 so that vectors 36 and 37 point to the antiparallel and the resistance of cell 10 increases sharply.

Similarly, assuming cell 10 is in the state in which vectors 36 and 37 point to the antiparallel under no magnetic field. When the magnetic field reaches to a value $H_4$ moving to the left along the abscissa, vector 36 of layer 11 switches to the left direction, with the magnetic vectors now being represented by vectors 39 and the resistance of cell 10 drops. Vectors 39 point to the same direction to the left under the magnetic field beyond the value $H_4$. When the magnetic field decreases down to a value $H_3$, vectors 39 hold the same direction between values $H_4$ and $H_3$. Upon applying the magnetic field of the value less than $H_3$, a magnetic vector of layer 13 switches to right, and the resistance of cell 10 increases perceptibly. It should be noted that the vectors of layers 11 and 13 always point in the antiparallel under the magnetic field between $H_4$ and $H_2$, including no magnetic field, and cell 10 indicates high resistivity when the L/W ratio is in a range of 1 to 5.

Figure 5:
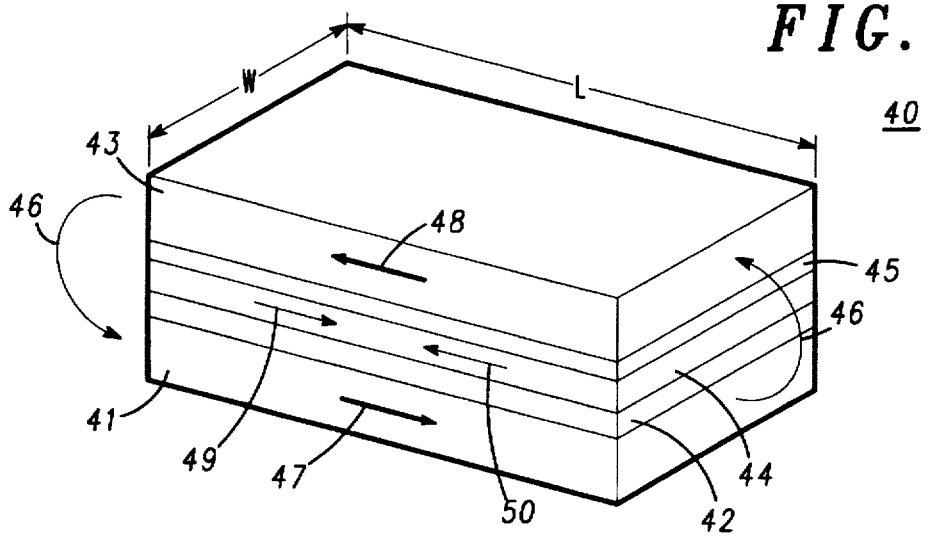
FIG. 5 is a simplified perspective view of a multi-layer magnetic memory cell in accordance with the present invention.

FIG. 5 is a simplified perspective view of a cell 40, connected in a first embodiment of the present invention. Cell 40 has a L/W ratio in a range of 1 to 5. Cell 40 includes a first magnetic layer 41 and a second magnetic layer 43, a electrically conductive layer 42 on first magnetic layer 41, a third magnetic layer 44 on conductive layer 42, and an insulating layer 45 between third magnetic layer 44 and second magnetic layer 43. First and second magnetic layers 41 and 43, which may be composed of a magnetic material such as a layer of cobalt, have 110 angstrom in thickness, and third magnetic layer 44 is a layer of nickel-iron (NiFe) and 40 angstrom thick which is thinner than first and second magnetic layers 41 and 43. Conductive layer 42 including a layer of copper (Cu) is electrically conductive and has a 10–50 angstrom thickness. Insulating layer 45 is a non-magnetic layer of aluminum oxide ($Al_2O_3$) having 10–30 angstrom in thickness. It should be understood that the described materials and thicknesses are only for purposes of a specific example and are not intended to limit the scope of the invention. Another embodiment of cell 40 is to have insulating layer 42 and conductive layer 45.

Since the L/W ratio of cell 40 is in a range between 1 and 5, magnetic vectors 47 and 48 are antiferromagnetically and strongly coupled between first and second magnetic layers 41 and 43 of cell 40 and form a fixed flux loop as illustrated by bold arrows 46 in FIG. 5. In contrast, magnetic vectors 49 and 50 in third magnetic layer 44 are switchable because they are weakly coupled with either of layers 41 or 43. Consequently, read and write states are provided in cell 40 by magnetic layer 44, which states are switchable with a low magnetic field, resulting in less power consumption. Further, the shape of cell 40 can be oval or almost circular to produce single magnetic domains for reproducibility and low-field switching of the cells.

Figure 6:
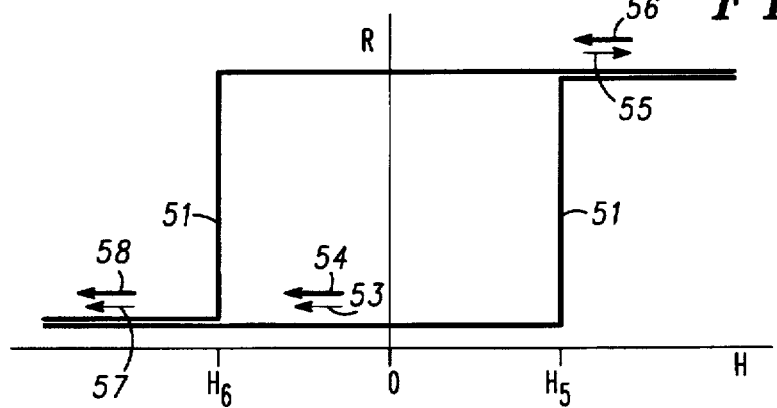
FIG. 6 is a graph generally illustrating switching characteristics of the cell shown in FIG. 5.

FIG. 6 shows a graph generally illustrating switching characteristics of cell 40 in FIG. 5. Bold and narrow arrows in FIG. 6 indicate directions of magnetic vectors in second and third layers 43 and 44, respectively. The abscissa of the graph indicates magnetic field direction and strength and the ordinate represents the resistance of cell 40. Further, a first curve 51 indicates the cell resistance which can be achieved for the application of various strengths of a magnetic field in a first direction and curve 52 indicates the cell resistance which can be achieved for the application of various strengths of a magnetic field in a second direction.

Assuming memory cell 40 is in the state in which magnetic vectors 53 and 54 point to the parallel under no magnetic field, moving to the right along the abscissa, the magnetic field increases up to a value $H_5$. Before the value $H_5$ is reached, magnetic vectors 53 and 54 are oriented in the parallel, and the magnetic resistance of cell 40 is low. Upon applying sufficient magnetic field $H_5$ to cell 40, vector 53 in layer 44 switches to the right direction (as shown) and the magnetic resistance of cell 40 increases perceptibly. Then, vectors 55 and 56 point in the antiparallel under a magnetic field beyond the value $H_5$. When the magnetic field decreases down to a value $H_6$ moving to the left along the abscissa, vectors 55 and 56 hold the antiparallel direction between values $H_5$ and $H_6$. Upon applying the magnetic field of the value $H_6$, vector 55 of layer 44 switches to a left direction, represented as vector 57 so that vectors 57 and 58 point to the same direction and the magnetic resistance of cell 40 decreases sharply.

Figure 7:
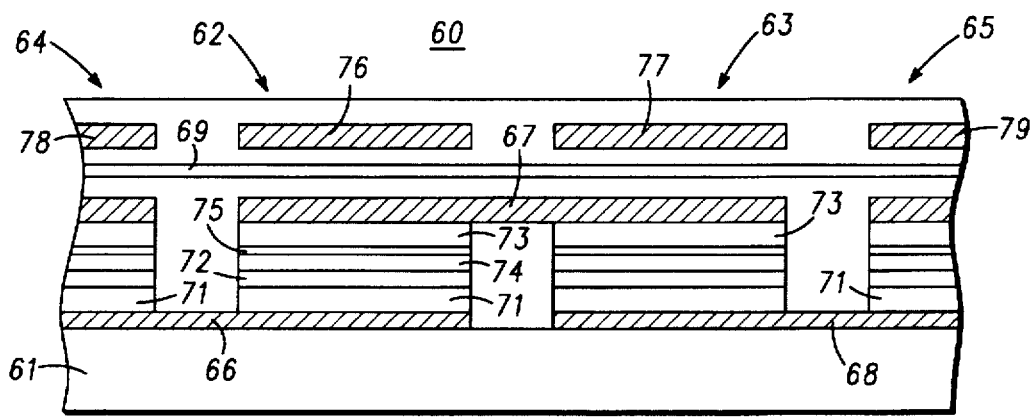
FIG. 7 is a simplified section view of a MRAM array employing the multi-layer magnetic memory cell shown in FIG. 5.

FIG. 7 is a simplified section view of a MRAM array 60 employing the multi-layer magnetic memory cell 40 shown in FIG. 5, connected in a first embodiment. The cells in array 60 each have a L/W ratio in a range of 1 and 5, consequently the total memory density increases. It will of course be understood that for convenience FIG. 7 illustrates only a portion of a single row of cells in array 60 and that array 60 extends into and out of the paper as well as to the left and right. A semiconductor substrate 61 is provided which may include CMOS circuitry, on which array 60 is formed. An adjacent pair of cells 62 and 63 are illustrated in their entirety with cells 64 and 65 partially illustrated for simplicity. Cell 62 includes first, second and third layers 71, 73, and 74 of magnetic material with a layer 72 of electrically conductive material placed between layers 71 and 74 and a layer 75 of insulating material sandwiched between layers 73 and 74. Similarly, cells 63, 64, and 65 each have the same structure as cell 62. The various layers of material in the cells are numbered similarly herein because they will generally be fabricated from common layers of material.

An electrically conductive portion 66 is positioned in electrical contact with layer 71 of cell 62 and layer 71 of adjacent cell 64. Also, an electrically conductive portion 67 is positioned in electrical contact with layer 73 of cell 62 and layer 73 of adjacent cell 63. Further, an electrically conductive portion 68 is positioned in electrical contact with layer 71 of cell 63 and layer 71 of adjacent cell 65. Since each of the cells 62–65 is a tunneling junction cell that conducts current through the insulating layer from one magnetic layer to the other, electrically conductive portions 66, 67, and 68 connect cells 62–65 into a series circuit.

An electrically conductive word line 76 extends perpendicular to cell 62 and is positioned adjacent cell 62 so as to provide a magnetic field around cell 62 when word line 76 is activated. Similar word lines 77, 78, and 79 are provided adjacent cells 63, 64, and 65, respectively. Word line 76 receives current (flowing into or out of the paper) to provide a sufficient magnetic field to at least partially switch the magnetization vectors in magnetic layer 74 from a first direction along the length of the layer to a second, opposite direction along the length of the layer. In this specific example, the series connected cells form a sense line having end terminals. A transistor (not shown) is connected in series at the end terminal of the sense line and is activated by a signal which turns on the transistor to provide a sensing current. The small sensing current is then passed through the sense line to determine changes in the magnetic resistance, as the word lines are activated to partially switch the various cells making up the sense line. In this way the state of each cell can be conveniently and easily sensed.

Generally, additional current must be applied to each cell to create sufficient magnetic field which, in conjunction with the magnetic field created by the current in the word line, sets a specific cell to a desired state. In a preferred embodiment a second line (one per row of cells), herein referred to as a write line and designated 69 in FIG. 7, is included and extends generally parallel with the sense line and perpendicular to the word lines. To write data (store a desired state) in the cells the word and write lines are activated so that approximately one half the required write current is applied to each of the selected lines. As in the sensing procedure, a specific cell is selected by selecting the word line and the write line that crosses at that cell. The magnetic fields produced by current flowing in the lines combines to produce a sufficient amount of switching magnetic field at the selected cell and only at the selected cell.

Assume for example that sixty Oersteds are required to switch the magnetization vectors of layer 74 in cell 62. Sufficient current is then applied to word line 76 to create a magnetic field having a strength of thirty Oersteds. By applying sufficient current to line 69 associated with cell 62, a magnetic field having a strength of thirty Oersteds is created by line 69. The two magnetic fields combine at cell 62 (and only at cell 62) to create a total magnetic field sufficient to change the magnetization vectors of layer 74 of cell 62. Thus, cell 62 has been uniquely addressed and set to a desired state, depending upon the direction of the magnetic field created. Since word line 76 and line 69 cross only at cell 62 the combined magnetic field is created only at cell 62.

A process for reading the cells in each row is relatively easy and fast. First, a sense signal is applied to the sense line of the selected row. This signal is large enough to read a change in resistance but well below the threshold level which will cause the magnetic vectors to switch. Second, a signal of sufficient amplitude to cause layer 74 to switch (with or without the sense current) is applied to the word line corresponding to the cell it is desired to read. For example, a current sufficient to produce a positive magnetic field $H_5$ is applied to word line 76 to read cell 62. If an increase in resistance is detected with the sense signal, cell 62 is in the "1" state, and if no change in resistance is detected with the sense signal, cell 62 is in the "0" state. If the state "1" is detected, the opposite polarity field has to be applied to set the state back. Each of the other cells in the row can be tested by applying a similar current to the associated word line.

Figure 8:
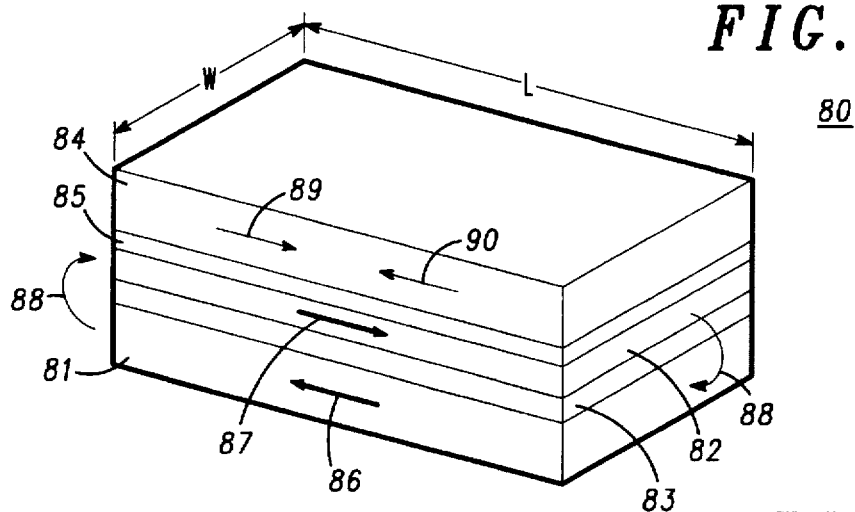
FIG. 8 is a simplified perspective view of another multi-layer magnetic memory cell in accordance with the present invention.

FIG. 8 is a simplified perspective view of another multi-layer magnetic memory cell 80 in accordance with the present invention. Cell 80 has a first magnetic layer 81 and a second magnetic layer 82, which are separated by an insulating layer 83. A third magnetic layer 84 is formed on an electrically conductive layer 85 by which second and third magnetic layers 82 and 84 are separated. First, second, insulating, third, and conductive layers 81-85 can utilize the same material as layers in cell 40. Cell 80 has a width and a length which are indicated as W and L in FIG. 8. In the same way as cell 40, when a L/W ratio of cell 40 is in a range of 1 and 5, magnetic vector 86 in first magnetic layer 81 is antiferromagnetically coupled with magnetic vector 87 in second magnetic layer 82 so that a fixed flux loop 88 is formed. Second and third magnetic layers 82 and 84 which are separated by conductive layer 85 form giant magnetoresistive material. Magnetic vectors 89 and 90 in third magnetic layer 84 are weakly coupled with magnetic vector 87 so that directions of magnetic vectors 89 and 90 can be easily switched under a certain magnetic field. Since cell 80 has the same switching characteristics as cell 40, magnetic field over a value $H_5$ and a value $H_6$ allows magnetic vectors in third magnetic layer 84 to switch.

Figure 9:
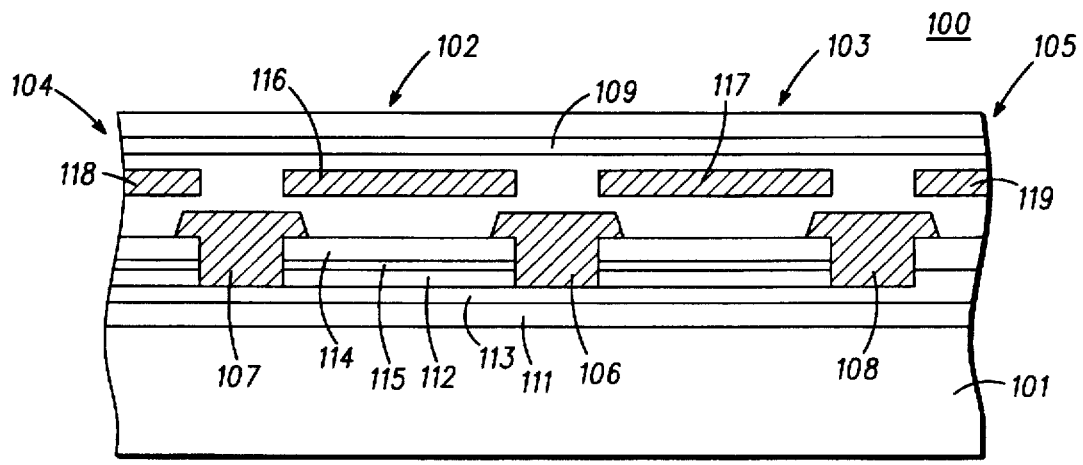
FIG. 9 is a simplified section view of a MRAM device employing the multi-layer magnetic memory cell shown in FIG. 8.

FIG. 9 is a simplified section view of a MRAM device employing the multi-layer magnetic memory cell 80 shown in FIG. 8, connected in a second embodiment. It will of course be understood that for convenience FIG. 9 illustrates only a portion of a single row of cells in array 100 just like array 60 in FIG. 7. A semiconductor substrate 101 is provided, on which array 100 is formed. An adjacent pair of cells 102 and 103 are illustrated in their entirety with cells 104 and 105 partially illustrated for simplicity. Cell 102 includes first, second, and third layers 111, 112, and 114 of magnetic material with a layer 113 of insulating material placed between layers 111 and 112 and a layer 115 of electrically conductive material sandwiched between layers 112 and 114. Similarly, cells 103, 104, and 105 each have the same structure as cell 102. The various layers of material in the cells are numbered similarly herein because they will generally be fabricated from common layers of material.

An electrically conductive portion 106 is made between magnetic cells 102 and 103. Also, electrically conductive portions 107 and 108 are formed between cells 102 and 104, and between cells 103 and 105, respectively. Conductive portions 106-108 connect cells 102-105 in series, which form a sense line to detect states contained in layer 115. Electrically conductive word line 116 is positioned adjacent cell 102 and perpendicular thereto so as to provide a magnetic field around cell 102 when word line 116 is activated. Word lines 117-119 are similarly arranged adjacent cells 103-105, respectively. A conductive line 109, which is referred as write line 69 in FIG. 7, is provided and extends parallel with the sense line to assist a magnetic field generated by a word line.

Array 100 basically operates in the same way as array 60 because array 100 has the same switching characteristics as array 60 which is shown in FIG. 6. To write data in cell 102, for example, word line 116 and write line 109 or a sense line are activated so that a magnetic field (over value $H_5$ or $H_6$ in FIG. 6) enough to change a direction of magnetic vectors in layer 114 of cell 102 is provided. In a process for reading cell 102, for example, a sense signal is applied to the sense line, and word line 116 are also activated to provide a magnetic field over value $H_5$ around cell 102. If magnetic resistance increases, cell 102 contains the "1"state. If no change in resistance is detected, cell 102 is in the "0" state. If the "1" state is detected, cell 102 has to be restored with an application of opposite direction magnetic field.

Thus, the present invention provides new and improved multi-state, multi-layer magnetic memory cells and memory devices which reduce the power consumption and increase the memory density.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A multi-state, multi-layer magnetic device having a length and a width comprising:
   a first magnetic layer;
   a second magnetic layer magnetically coupled with the first magnetic layer, directions of magnetic vectors in the second magnetic layer being antiparallel with magnetic vectors in the first magnetic layer;
   a third magnetic layer placed adjacent to the second magnetic layer, directions of magnetic vectors in the third magnetic layer being switchable; and
   the width of the multi-state, multi-layer magnetic device being less than a width of a magnetic domain wall and a ratio of the length of the multi-state, multi-layer magnetic device to the width of the multi-state, multi-layer magnetic device being in a range of 1 to 5.

2. The multi-state, multi-layer magnetic device as claimed in claim 1 wherein the third magnetic layer is placed between the first and second magnetic layers.

3. The multi-state, multi-layer magnetic device as claimed in claim 2 further including an electrically insulating layer placed between the second magnetic layer and the third magnetic layer.

4. The multi-state, multi-layer magnetic device as claimed in claim 3 further including an electrically conductive layer placed between the first magnetic layer and the third magnetic layer.

5. The multi-state, multi-layer magnetic device as claimed in claim 1 wherein the second and third magnetic layers form a magnetic tunneling junction memory portion including a non-conductive layer therebetween and the third layer whereby directions of magnetic vectors in the third magnetic layer causes an amount of a tunneling current flowing in the non-conductive layer to vary.

6. The multi-state, multi-layer magnetic device as claimed in claim 4 wherein the electrically insulating layer has a thickness less than 40 angstrom.

7. The multi-state, multi-layer magnetic device as claimed in claim 1 wherein the second magnetic layer is placed between the first and third magnetic layers.

8. The multi-state, multi-layer magnetic device as claimed in claim 7 further including an electrically conductive layer between the second magnetic layer and the third magnetic layer.

9. The multi-state, multi-layer magnetic device as claimed in claim 1 wherein the second and third magnetic layers form a giant magnetoresistive material portion including a conductive layer therebetween and the third layer whereby directions of magnetic vectors in the third magnetic layer cause an amount of a current flowing in the giant magnetoresistive material portion to vary.

10. The multi-state, multi-layer magnetic device as claimed in claim 8 wherein the electrically conductive layer has a thickness of 10 to 50 angstrom.

11. The multi-state, multi-layer magnetic device as claimed in claim 8 further including an electrically insulating layer between the first magnetic layer and the second magnetic layer.

12. The multi-state, multi-layer magnetic device as claimed in claim 11 wherein the second magnetic layer, the third magnetic layer, and the electrically conductive layer form a giant magnetoresistive device.

13. An array of multi-state, multi-layer magnetic memory cells comprising:

a semiconductor substrate on which the multi-layer magnetic memory is formed;

a plurality of multi-layer magnetic memory cells, each cell comprising:
   a first magnetic layer;
   a second magnetic layer magnetically coupled with the first magnetic layer, directions of magnetic vectors in the second magnetic layer being antiparallel with magnetic vectors in the first magnetic layer;
   a third magnetic layer placed adjacent to the second magnetic layer, directions of magnetic vectors in the third magnetic layer being switchable; and
   the width of the multi-state, multi-layer magnetic memory cell being less than a width of a magnetic domain wall and a ratio of the length of the multi-state, multi-layer magnetic memory cell to the width of the multi-state, multi-layer magnetic memory cell being in a range of 1 to 5;

a plurality of word lines, one each associated with each column of multi-layer magnetic memory cells, the associated word line in each column being placed adjacent each multi-layer magnetic memory cells, for providing a word current by which a magnetic field is generated to switch directions of magnetic vectors in the third magnetic layer; and a plurality of sense lines for providing a sense current in order to sense states in the third magnetic layer.

14. The array of multi-state, multi-layer magnetic memory cells as claimed in claim 13 wherein the third magnetic layer is placed between the first magnetic layer and the second magnetic layer, an electrically conductive layer is placed between the first magnetic layer and the third magnetic layers, and an electrically insulating layer is placed between the second magnetic layer and the third magnetic layer.

15. The array of multi-state, multi-layer magnetic memory cells as claimed in claim 14 wherein upper conductive lines and lower conductive lines are electrically and alternatively connected between upper layers of multi-layer magnetic memory cells and between lower layers of multi-layer magnetic memory cells, respectively so as to form the sense line.

16. The array of multi-state, multi-layer magnetic memory cells as claimed in claim 13 wherein the second magnetic layer is placed between the first magnetic layer and the third magnetic layer, an electrically insulating layer is placed between the first magnetic layer and the second magnetic layers, and an electrically conductive layer is placed between the second magnetic layer and the third magnetic layer.

17. The array of multi-state, multi-layer magnetic memory cells as claimed in claim 16 wherein at least the second magnetic layers, the third magnetic layers, and the conductive layers are electrically connected between the multi-layer magnetic memory cells so as to form the sense line.

18. A multi-state, multi-layer magnetic memory cell comprising:

first, second, and third magnetic layers;

an insulating layer positioned between the first and second magnetic layers; and an electrically conductive layer positioned between the second and third magnetic layers;

wherein a ratio of a length of the multi-state, multi-layer magnetic memory cell to a width of the multi-state, multi-layer magnetic memory cell is in a range of 1 to 5.

19. The multi-state, multi-layer magnetic memory cell as claimed in claim 18 wherein magnetic vectors in the first magnetic layer are antiferromagnetically coupled with magnetic vectors in the second magnetic layer.

20. The multi-state, multi-layer magnetic memory cell as claimed in claim 19 wherein directions of magnetic vectors in the third magnetic layer are switchable.

* * * * *

UNITED STATES PATENT AND TRADEMARK OFFICE
CERTIFICATE OF CORRECTION

PATENT NO.    : 5,768,181
DATED         : June 16, 1998
INVENTOR(S)   : Zhu et al.

It is certified that error appears in the above-identified patent and that said Letters Patent is hereby corrected as shown below:

<u>Column 1,</u>
Line 4, after the Title, please add as a new first paragraph the following paragraph:
    -- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*